United States Patent
Searle (10) Patent No.: US 9,712,117 B2
(45) Date of Patent: Jul. 18, 2017

(54) CASCODE SWITCH FOR POWER AMPLIFIER

(71) Applicant: SKYWORKS SOLUTIONS, INC., Woburn, MA (US)

(72) Inventor: Kenneth Michael Searle, Dunmow (GB)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/965,633

(22) Filed: Dec. 10, 2015

(65) Prior Publication Data

US 2016/0190996 A1 Jun. 30, 2016

Related U.S. Application Data

(60) Provisional application No. 62/098,186, filed on Dec. 30, 2014.

(51) Int. Cl.
| | |
|---|---|
| H03F 3/04 | (2006.01) |
| H03F 1/02 | (2006.01) |
| H03F 3/21 | (2006.01) |
| H03F 3/72 | (2006.01) |
| H03F 1/22 | (2006.01) |
| H03F 3/191 | (2006.01) |
| H03F 3/195 | (2006.01) |
| H03F 3/24 | (2006.01) |

(52) U.S. Cl.
CPC ............ *H03F 1/0277* (2013.01); *H03F 1/22* (2013.01); *H03F 3/191* (2013.01); *H03F 3/195* (2013.01); *H03F 3/211* (2013.01); *H03F 3/245* (2013.01); *H03F 3/72* (2013.01); *H03F 2200/451* (2013.01); *H03F 2203/21109* (2013.01)

(58) Field of Classification Search
USPC .......................................... 330/311, 51, 148
IPC ........................................................ H03F 3/04
See application file for complete search history.

(56) References Cited

U.S. PATENT DOCUMENTS

| | | | |
|---|---|---|---|
| 6,046,640 A | 4/2000 | Brunner | |
| 6,252,463 B1 | 6/2001 | Kobayashi | |
| 6,297,701 B1 * | 10/2001 | Visocchi | H03F 3/087 |
| | | | 250/214 A |

(Continued)

FOREIGN PATENT DOCUMENTS

| | | |
|---|---|---|
| JP | H10190379 | 7/1998 |
| JP | H11234148 | 8/1999 |

(Continued)

*Primary Examiner* — Patricia T Nguyen
(74) *Attorney, Agent, or Firm* — Knobbe, Martens, Olson & Bear, LLP (57) ABSTRACT

Aspects of this disclosure relate to a cascode circuit electrically coupled between an amplifier configured to amplify a radio frequency (RF) signal and different loads. The cascode circuit can function as a switch to selectively provide an output from the amplifier to a number of different loads. In certain embodiments, the cascode circuit can be electrically coupled between different stages of a multi-stage power amplifier. For instance, the amplifier can be a first stage of the multi-stage power amplifier and the different loads can include different power amplifier transistors of a second stage of the multi-stage amplifier. The cascode circuit can be implemented by bipolar transistors according to certain embodiments.

22 Claims, 7 Drawing Sheets

(56) References Cited

U.S. PATENT DOCUMENTS

| | | | |
|---|---|---|---|
| 6,429,721 B1* | 8/2002 | Armitage | H03D 7/1441 327/359 |
| 6,765,268 B2 | 7/2004 | Akamine et al. | |
| 2003/0129958 A1* | 7/2003 | Behzad | H03D 7/1441 455/326 |
| 2007/0116015 A1* | 5/2007 | Jones | H03D 7/1441 370/396 |
| 2010/0029239 A1* | 2/2010 | Asuri | H03D 7/1441 455/333 |
| 2010/0141337 A1* | 6/2010 | Chen | H03F 1/223 330/124 R |
| 2013/0316669 A1 | 11/2013 | Davierwalla et al. | |
| 2014/0210554 A1* | 7/2014 | Abdelhalem | H03F 1/22 330/296 |

FOREIGN PATENT DOCUMENTS

| WO | WO 01-28087 | 4/2001 |
|---|---|---|
| WO | WO 2013-150564 | 10/2013 |

\* cited by examiner

CASCODE SWITCH FOR POWER AMPLIFIER

CROSS-REFERENCE TO RELATED APPLICATION

This application claims the benefit of priority under 35 U.S.C. §119(e) of U.S. Provisional Patent Application No. 62/098,186, filed Dec. 30, 2014 and titled "CASCODE SWITCH FOR POWER AMPLIFIER", the entire disclosure of which is hereby incorporated by reference in its entirety herein.

BACKGROUND

Technical Field

This disclosure relates to electronic systems and, in particular, to cascode circuits.

Description of Related Technology

Power amplifiers can be included in wireless communication devices to amplify a radio frequency (RF) signal for transmission via an antenna. RF signals can be in a frequency range from about 30 kHz to 300 GHz. Certain power amplifiers can operate in multiple modes of operation. For example, different modes of operation can be associated with different power modes. There are a number of design tradeoffs associated with efficiently operating in each of the multiple modes of operation while also achieving a desired level of performance in each of the multiple modes of operation.

Some multi-mode power amplifiers include RF signal paths associated with different modes of operation. One or more selected RF signal paths can be switched 'in' or switched 'out' in a particular mode of operation. Certain switch elements that are relatively low-loss and have relatively low-distortion can be expensive to implement and may not be easily implemented on the same die as the power amplifier.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a power amplifier system that includes a first power amplifier stage, a second power amplifier stage, and a cascode circuit. The first power amplifier stage is configured to amplify a radio frequency (RF) signal. The second power amplifier stage includes a first power amplifier transistor and a second power amplifier transistor. The cascode circuit includes a first cascode transistor and a second cascode transistor. The first cascode transistor is configured to selectively provide an output from the first power amplifier stage to the first power amplifier transistor. The second cascode transistor configured to selectively provide the output from the first power amplifier stage to the second power amplifier transistor.

The first power amplifier stage, the second power amplifier stage, and the cascode circuit can be embodied on a single die. The single die can be formed using a SiGe bipolar transistor process or a GaAs heterojunction bipolar transistor process.

The cascode circuit can include bipolar cascode transistors. For instance, the first cascode transistor can be a first bipolar cascode transistor and the second cascode transistor can be a second cascode transistor. The first power amplifier stage can include a first power amplifier stage bipolar transistor having a collector that is electrically connected to an emitter of the first cascode bipolar transistor and an emitter of the second cascode bipolar transistor. In certain embodiments, a feedback circuit can provide feedback from a collector of at least one of the first cascode bipolar transistor or the second cascode bipolar transistor to an input of the first power amplifier stage. Alternatively or additionally, a termination circuit electrically coupled to a base of the first cascode bipolar transistor can provide a termination impedance to the base of the first cascode bipolar transistor.

The output of the first power amplifier stage can be provided to different power amplifier transistors of the second power amplifier stage in different modes of operation. For example, the first power amplifier transistor can receive the output of the first power amplifier stage in a high power mode and the second power amplifier transistor can receive the output of the first power amplifier stage in a low power mode. Alternatively or additionally, the first power amplifier transistor can receive the output of the first power amplifier stage when the output is within a first frequency band and the second power amplifier transistor can receive the output of the first power amplifier stage when the output is within a second frequency band.

The first power amplifier transistor can be implemented by a first transistor array having a larger physical area than a second transistor array that implements the second power amplifier transistor.

The second power amplifier stage can include a third power amplifier transistor and the cascode circuit can include a third cascode transistor configured to selectively provide the output from the first power amplifier stage to the third power amplifier transistor.

Another aspect of this disclosure is a semiconductor die that includes a first power amplifier transistor, a second power amplifier transistor, and a cascode circuit. The cascode circuit includes a first cascode bipolar transistor and a second cascode bipolar transistor. The first cascode bipolar transistor is configured to selectively provide a radio frequency (RF) signal to the first power amplifier transistor. The second cascode bipolar transistor configured to selectively provide the RF signal to the second power amplifier transistor.

An emitter of the first cascode bipolar transistor can be electrically connected to an emitter of the second cascode bipolar transistor. A first stage power amplifier bipolar transistor can have a collector electrically connected to the emitter of the first cascode bipolar transistor and the emitter of the second cascode bipolar transistor.

The cascode circuit can include SiGe bipolar transistors or GaAs heterojunction bipolar transistors.

A termination circuit can be electrically connected to a base of the first bipolar cascode transistor.

Another aspect of this disclosure is a packaged power amplifier module that includes a power amplifier die, a packaging substrate on which the power amplifier die is disposed, and an encapsulation over the packaging substrate and the power amplifier die. The power amplifier die includes a first power amplifier stage, a second power amplifier stage, a first cascode bipolar transistor configured to selectively provide a radio frequency (RF) signal from the first power amplifier stage to a first power amplifier transistor of the second power amplifier stage in a first mode, and a second cascode bipolar transistor configured to selectively provide the RF signal from the first power amplifier stage to a second power amplifier transistor of the second power amplifier stage in a second mode.

The first power amplifier transistor can be a GaAs heterojunction bipolar transistor. The packaged power amplifier module can include a surface mounted component on the packaging substrate, and the surface mounted component being in communication with the power amplifier die. The packaged power amplifier module can include a wire bond providing an electrical connection from the power amplifier die to a pad on the packaging substrate.

Another aspect of this disclosure is an amplification circuit that includes an amplifier bipolar transistor, first and second loads, and a cascode circuit. The cascode circuit includes a first cascode bipolar transistor and a second cascode bipolar transistor. The first cascode bipolar transistor is configured to selectively provide an output from the amplifier bipolar transistor to the first load. The second cascode bipolar transistor is configured to selectively provide the output from the amplifier bipolar transistor to the second load.

The amplifier bipolar transistor can include a base configured to receive a radio frequency signal and a collector configured to provide an amplified radio frequency signal. The collector of the amplifier bipolar transistor can be electrically connected to the first cascode bipolar transistor and the second cascode bipolar transistor.

The first cascode bipolar transistor can provide the output of the amplifier bipolar transistor to the first load in a first mode of operation and the second cascode bipolar transistor can provide the output of the amplifier bipolar transistor to the second load in a second mode of operation. The modes of operation can be associated with power modes (e.g., low power mode and high power mode) and/or a frequency band of the output from the amplifier bipolar transistor.

Another aspect of this disclosure is a wireless communication device. The wireless communication device includes a power amplifier system, an antenna, and a switch module configured to selectively electrically connect an output of the power amplifier system to the antenna. The power amplifier system includes a first power amplifier stage, a second power amplifier stage, and a cascode circuit. The first power amplifier stage is configured to amplify a radio frequency (RF) signal. The second power amplifier stage includes a first power amplifier transistor and a second power amplifier transistor. The cascode circuit includes a first cascode transistor and a second cascode transistor. The first cascode transistor is configured to selectively provide an output from the first power amplifier stage to the first power amplifier transistor. The second cascode transistor configured to selectively provide the output from the first power amplifier stage to the second power amplifier transistor. In certain embodiments, the power amplifier system can provide a wireless local area network signal to the antenna via the switch module.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A power amplifier (PA) can amplify a radio frequency (RF) signal in two or more modes of operation. For example, a first mode of operation can be a high power mode and a second mode of operation can be a low power mode.

In the first mode of operation, the PA can deliver a relatively high power output signal. An array of amplifying transistors of the power amplifier can be sufficiently large to deliver the desired high power output signal. If such an array of amplifying transistors is too small, then the amplifying transistors of the array may be driven relatively close to a high level injection region of the transistor characteristic such that the linearity of the amplified signal can be degraded. In other words, the amplified RF signal provided by the PA can be distorted by saturation of the transistors within an improperly sized array.

Providing a suitably sized array of amplifying transistors is a design choice that also involves a range of other design considerations including, for example, the selection of the PA load line and the matching circuit elements. Selection of the PA load line and array size can determine the efficiency of the PA in addition to a number of other performance attributes of the PA. Moreover, selection and design of a proper matching circuit can determine how efficiently an amplified RF signal from the PA array is transferred to a subsequent RF signal conditioning element in the RF chain (e.g., an antenna, an RF switch, etc.). In facilitating the high power mode of operation, a number of design choices can optimize the PA for the high power mode.

In the second mode of operation, the PA can deliver a relatively low power output signal. The low power output signal has a lower power level than the high power output signal. Design choices made for the first mode of operation may be suboptimal and/or inappropriate for the second mode of operation. Accordingly, such design choices can result in significantly inefficient operation of the PA in the second mode of operation. The lower power mode of operation of the PA may be better served with a smaller array of amplifying transistors and a completely different load line and matching circuit relative to when the PA operates in the higher power mode of operation.

Within the context of a multimode PA, it would be advantageous to be able to switch 'in' or switch 'out' two or more branches of the signal amplification path such that a selected branch configured for a specific mode is switched 'in' when operating in the specific mode and one or more the other branches are switched 'out' in the specific mode. For instance, in a PA having a low power mode and a high power mode, a first path that includes a larger array of transistors with an appropriate load line and matching circuit elements for high power mode can be switched 'in' for high power mode and a second path that includes a smaller array of transistors with an appropriate load line and matching circuit elements for low power mode can be switched 'in' for low power mode.

However, a relatively low-loss, relatively low-distortion switch element can be desirable for switching RF signals from one path such that the electronic system does not significantly lose or distort the RF signal that has been delivered from a previous stage of RF signal conditioning. In several semiconductor technology platforms, a relatively low-loss, relatively low-distortion switch is unavailable in the form of a metal oxide field effect transistor (MOSFET) or other types of devices that are typically useful as a switch (e.g., mechanical switches, diodes, etc.). In fact, in several semiconductor technology platforms suitable for power amplifiers, the only suitable device available to implement a switch on a power amplifier die is a bipolar transistor.

Accordingly, there is a need for an architecture that allows selection and switching between two or more RF signal paths to enable a selected RF path corresponding to a particular mode of operation for the PA by virtue of semiconductor and passive device elements that form the integrated circuit in that path.

In this disclosure, a cascode topology is described to switch between different RF signal paths. Each current buffer transistor in the cascode topology can either be turned on or turned off depending on the RF pathway that is desired for a selected mode of operation. The cascode transistors can be implemented by bipolar transistors.

In one embodiment, two current buffer transistors are electrically connected to a power amplifier transistor of a first stage of the PA. Depending on which current buffer transistor is turned on by a switch bias control signal provided by a bias control circuit, the RF signal is delivered from the first stage of the PA to an appropriately sized array of amplifying transistors of a second stage of the PA. In a low power mode, a first current buffer transistor can provide the RF signal from the first stage of the PA to a smaller amplifying transistor array and a second current buffer transistor can be turned off. In a high power mode, the second current buffer transistor can provide the RF signal from the first stage of the PA to a larger amplifying transistor array and the first current buffer transistor can be turned off. As one example, the smaller amplifying transistor array can have an emitter area of between about $\frac{1}{5}$ to about $\frac{1}{6}$ of the emitter area of the larger amplifying transistor array.

Accordingly, the cascode topology can effectuate a switching function using bipolar transistors, such as NPN bipolar transistors, to facilitating a PA with two modes of operation. Additional modes and/or RF signal paths can also be configured using this technique. Additional circuitry relating to stability and feedback can also be implemented.

The cascode topology can include a transconductance amplifier followed by two or more selectively enabled current buffers. The transconductance amplifier can be a common emitter amplifier in which a bipolar transistor amplifies a signal provided to its base and provides an amplified signal at its collector. The current buffer can be a common base amplifier in which a bipolar transistor amplifies a signal provided to its emitter and provides an amplified signal at is collector. The current buffer can be referred to as a cascode transistor. A cascode topology with a transconductance amplifier and a current buffer can provide relatively high input-output isolation, relatively high input impedance, relatively high output impedance, relatively high gain and bandwidth. Cascode topologies can reduce supply head-room for an amplifier stage due to biases applied to each transistor. In certain embodiments, a supply voltage can provide adequate headroom for a power amplifier system. For instance, in one implementation, the supply voltage can be at least about 3 Volts (e.g., about 3.3 Volts).

Embodiments discussed herein can advantageously enable two or more modes of operation by switching between different RF signal paths using bipolar transistor technology. Accordingly, such embodiments can be implemented in a relatively low cost bipolar-only process technology. Using the principles and advantages discussed herein, switching between different RF signal paths can also be achieved using other relatively low cost processes that do not feature low-loss, low-distortion RF switch devices such as field effect transistors.

Switching between different RF signal paths using bipolar transistors can enable such bipolar transistors to be implemented on a single die that also includes power amplifier transistors. As such, this can avoid the need for a second die to implement the low-loss, low-distortion RF switch devices to switch between the different RF paths associated with different modes of operation. In some embodiments, two stages of a power amplifier and the bipolar transistors serving as switches between these two stages can be implemented on a single die in a compact and integrated manner.

Moreover, the functionality of switching between different RF signal paths for different modes of operation can enable different RF signal paths to be configured and/or optimized for a particular mode or modes of operation. For example, different RF signal paths can be implemented for a higher power mode and a lower power mode. The different RF signal paths can include different transistors and different matching networks than each other such that a particular matching network can be configured for a particular amplifying transistor array output. This can simplify the separate output matching networks, which can significantly reduce the total die area for output matching.

Aspects of this disclosure relate to a multi-stage power amplifier with cascode transistors configured to selectively provide an output of one stage of the power amplifier to transistors of a subsequent stage of the power amplifier. Bipolar transistors can implement the cascode transistors and the power amplifier. Accordingly, in such implementations, the multi-stage power amplifier and the cascode transistors can be implemented when a field effect transistor is not available. For example, the multi-stage power amplifier and cascode transistors can be implemented on a single die formed using a process technology that implements bipolar transistors and does not implement field effect transistors. The multi-stage power amplifier can be a wireless local area network (WLAN) power amplifier with a low power state. Such a power amplifier can be implemented in a mobile computing device, such as a smart phone or a wearable computer (e.g., a smart watch).

A cascode circuit can include a first cascode transistor and a second cascode transistor. The first cascode transistor and the second cascode transistor can each serve as a current buffer. The first cascode transistor can selectively provide an RF signal from a first power amplifier stage to a first power amplifier transistor of a subsequent power amplifier stage. The second cascode transistor can selectively provide the RF signal from the first power amplifier stage to a second power amplifier transistor of the subsequent stage. A bias control circuit can turn on the first cascode transistor and turn off the second cascode transistor such that the first power amplifier transistor of the subsequent stage receives the RF signal in a first mode of operation (e.g., a high power mode of operation). The bias control circuit can turn off the first cascode transistor and turn on the second cascode transistor such that the second power amplifier transistor of the subsequent stage receives the RF signal in a second mode of operation (e.g., a low power mode of operation).

The first power amplifier transistor and the second power amplifier transistor of the subsequent stage can each have a different output matching network electrically coupled to its respective output. Such output matching networks can each be configured for different modes of operation. This can simplify the output matching networks and/or reduce the die area for the matching networks significantly.

Figure 1:
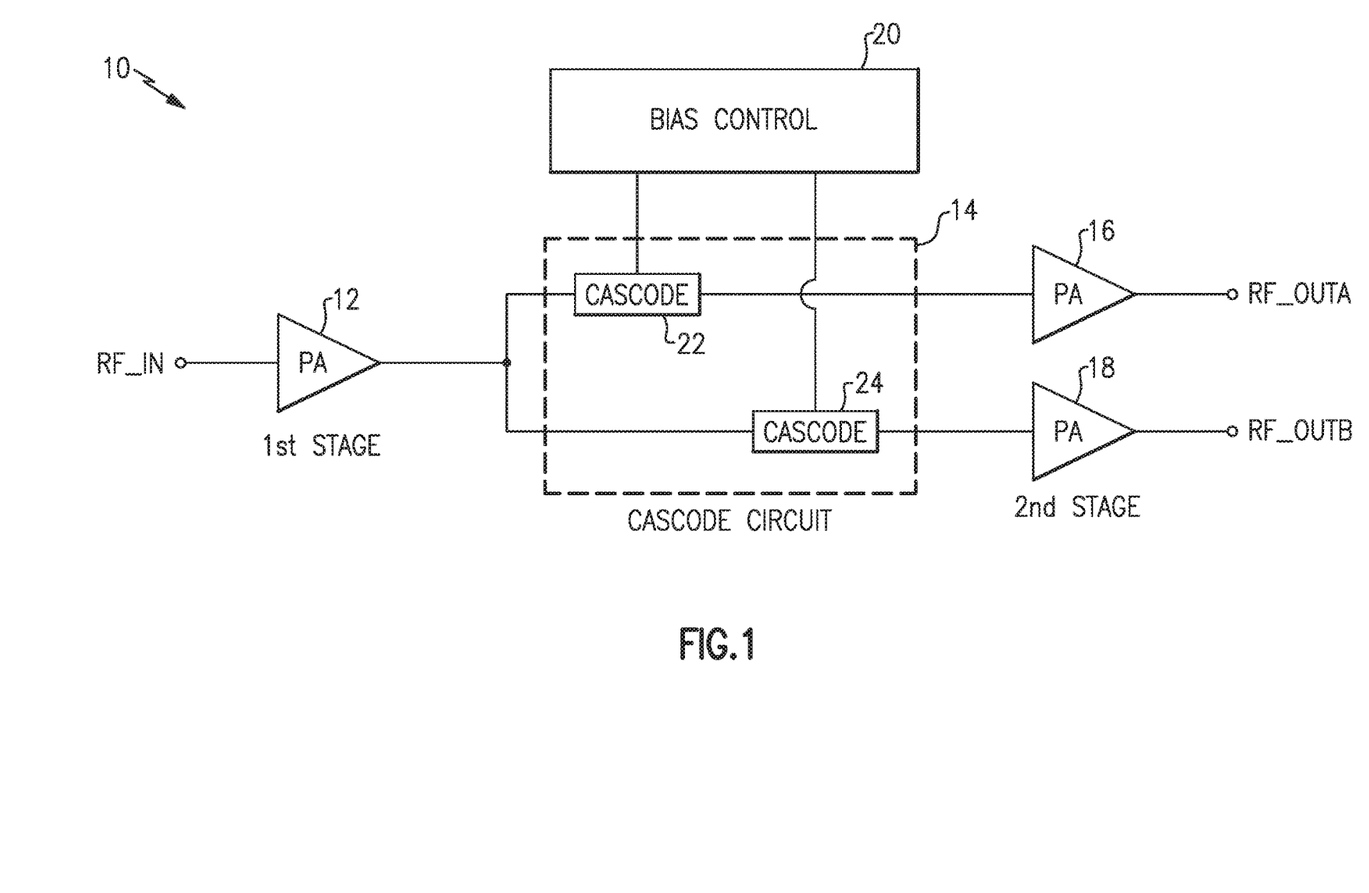
FIG. 1 is a schematic diagram of a power amplifier system that includes a multi-stage power amplifier with a cascode circuit between power amplifier stages according to an embodiment.

FIG. 1 is a schematic diagram of a power amplifier system 10 that includes a multi-stage power amplifier with a cascode circuit between power amplifier stages according to an embodiment. As illustrated, the power amplifier system 10 includes a first power amplifier stage 12, a cascode circuit 14, a second power amplifier stage including a first portion 16 and a second portion 18, and a bias control circuit 20. The power amplifier system 10 can transmit wireless local area network (WLAN) signals in certain implementations. In some applications, the power amplifier system 10 can provide an RF output signal in a 2.4 GHz frequency band and/or in a 5 GHz frequency band. The power amplifier system 10 can include more elements than illustrated in FIG. 1 and/or some embodiments can include a subset of the illustrated elements. The power amplifier system 10 can be implemented on a single die.

The first power amplifier stage 12 is configured to amplify an RF signal RF_IN and provide an amplified RF signal. The power amplifier stage 12 can include any suitable RF power amplifier transistor. For instance, the first power amplifier stage 12 can be implemented by one or more bipolar transistors, such as one or more SiGe bipolar transistors or one or more GaAs heterojunction bipolar transistors (HBTs). The first power amplifier stage 12 can be activated and deactivated as desired. For instance, a power amplifier bias signal (not illustrated in FIG. 1) provided to the first power amplifier stage 12 can deactivate the first power amplifier stage 12 when the amplified RF signal provided by the first power amplifier stage 12 is not being used.

The multi-stage power amplifier of FIG. 1 is arranged for operating in more than one mode of operation. The cascode circuit 14 can selectively provide the output of the first power amplifier stage 12 to the first portion 16 of the second power amplifier stage and/or the second portion 18 of the second power amplifier stage. The cascode circuit 14 together with the first stage 12 can function as a switched cascode amplifier. The cascode circuit 14 can serve as a switch to provide the RF output signal from the first power amplifier stage 12 to a selected portion of the second power amplifier stage. As illustrated, the cascode circuit 14 includes a first cascode transistor 22 and a second cascode transistor 24. When activated, the first cascode transistor 22 can electrically connect the first power amplifier stage 12 to the first portion 16 of the second stage. When activated, the second cascode transistor 24 can electrically connect the first stage power amplifier 12 to the second portion 18 of the second stage.

The bias control circuit 20 can provide a first signal to the first cascode transistor 22 and a second signal to the second cascode transistor 24. The bias control circuit 20 can be implemented by any suitable circuitry. The bias control circuit 20 can selectively bias the first cascode transistor 22 as a switch. The first cascode transistor 22 can turn on and turn off responsive to a signal level of the first signal. The bias control circuit 20 can selectively bias the second cascode transistor 24 as a switch. The second cascode transistor 24 can turn on and turn off responsive to a signal level of the second signal. Accordingly, the bias control circuit 20 can control the first cascode transistor 22 and the second cascode transistor 24 to selectively provide an RF signal to the first portion 16 and the second portion 18, respectively, of the second stage of the power amplifier. The first signal and the second signal can be generated based at least partly on an indication of a mode of operation of the power amplifier system. In one embodiment, the first signal and the second signal can be logical compliments. According to another embodiment, the first signal and the second signal can control the first cascode transistor 22 and the second transistor 24, respectively, such that both of these transistors are activated concurrently in a mode of operation. The bias control circuit 20 can be a wide bandwidth bias circuit providing a relatively low impedance to the cascode circuit 14.

Figure 2A:
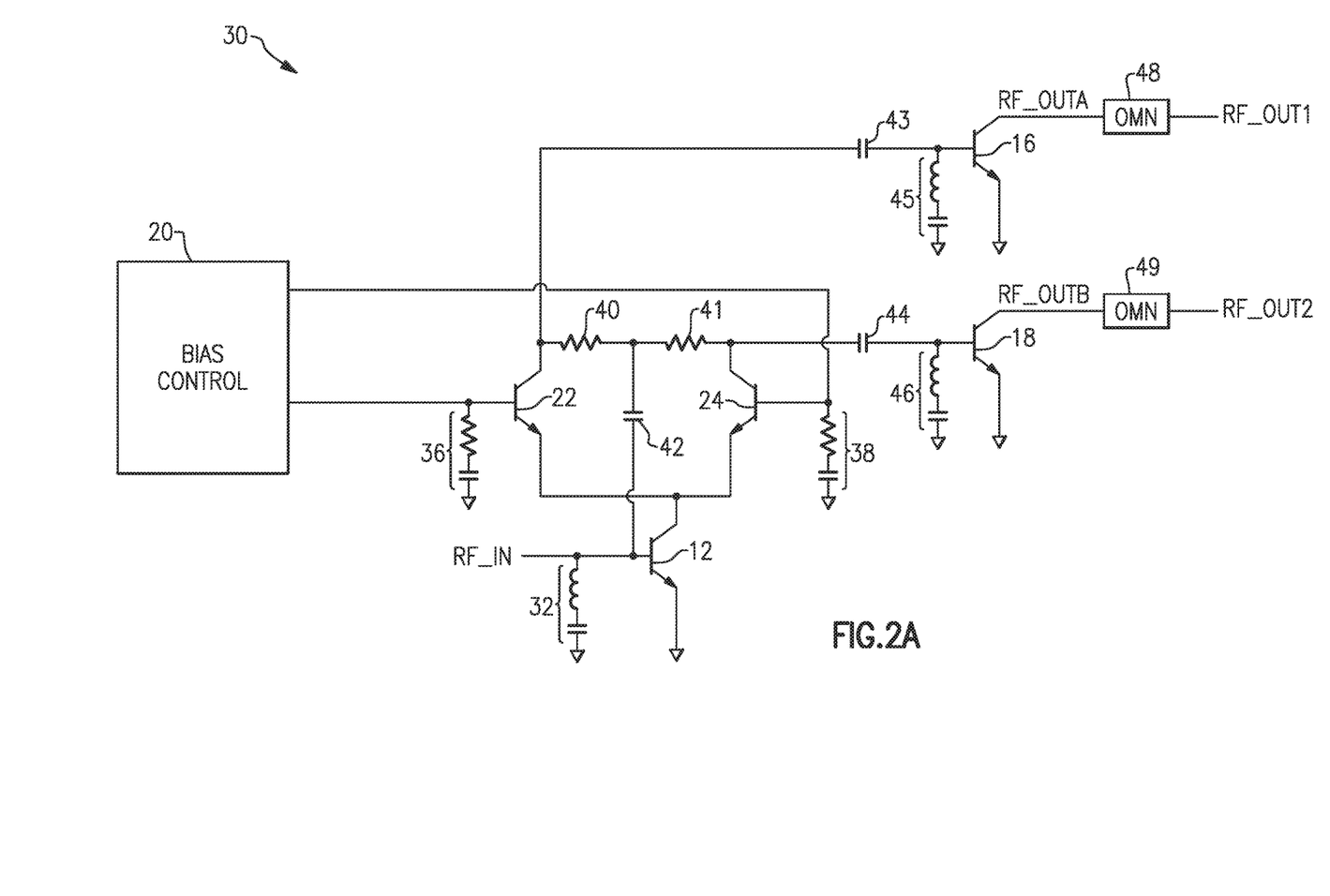
FIG. 2A is a schematic diagram of a power amplifier system that includes a multi-stage power amplifier with a cascode circuit between power amplifier stages according to an embodiment.

FIG. 2A is a schematic diagram of a power amplifier system 30 that includes a multi-stage power amplifier with a cascode circuit between power amplifier stages according to an embodiment. The power amplifier system 30 is an example of the power amplifier system 10 and also illustrates additional circuitry including corresponding output matching networks. As illustrated, the power amplifier system 30 includes a first power amplifier stage 12, cascode transistors 22 and 24, a first portion 16 and a second portion 18 of a second power amplifier stage, a bias control circuit 20, termination circuits 32, 36, 38, 45, and 46, a feedback circuit including resistors 40 and 41 and a capacitor 42, capacitors 43 and 44, and output matching networks 48 and 49. The power amplifier system 30 can include more elements than illustrated in FIG. 2A and/or some embodiments can include a subset of the illustrated elements. The power amplifier system 30 can be implemented on a single die in certain embodiments.

The first power amplifier stage 12 can be implemented by a bipolar transistor as shown in FIG. 2A. This bipolar transistor can be referred to as an amplifier bipolar transistor. Although the illustrated amplifier bipolar transistor is an NPN transistor, it will be understood that the principles and advantages discussed herein can be applied to PNP amplifier bipolar transistors. While illustrated as a single bipolar transistor, the first power amplifier stage 12 can be implemented by an array of bipolar transistors that together function as a single bipolar transistor. As shown in FIG. 2A, the first power amplifier stage 12 can be configured as a common emitter amplifier configured to amplify an RF signal received at its base. The termination circuit 32 can provide impedance matching at the base of the amplifier bipolar transistor. The termination circuit 32 can be implemented by one or more suitable passive circuit elements disposed between the base of the amplifier bipolar transistor and a reference voltage, such as aground. As illustrated in FIG. 2A, the termination circuit 32 is a series LC circuit. The emitter of the amplifier bipolar transistor can be electrically connected to ground or another suitable reference voltage. The collector of the amplifier bipolar transistor can be electrically connected to the cascode circuit that includes cascode transistors 22 and 24. As illustrated in FIG. 2A, the collector of the amplifier bipolar transistor is electrically connected to the emitter of the first cascode transistor 22 and the emitter of the second cascode transistor 24.

In FIG. 2A, the cascode circuit is implemented by bipolar transistors. Accordingly, these bipolar cascode transistors can selectively provide an RF signal from the collector of the amplifier bipolar transistor to a selected portion of the second stage of the power amplifier. This can implement a switching functionality in bipolar technology. The switching functionality performed by the bipolar cascode circuit can achieve suitable performance for switching RF signals when field effect transistors or other switching elements are unavailable to perform the switching functionality. Further, when the first and second power amplifier stages are also implemented by bipolar transistors, the cascode circuit, the first power amplifier stage, and the second power amplifier stage can be formed on a single die using a bipolar process.

The first cascode transistor 22 of FIG. 2A is a cascode bipolar transistor. Although the illustrated cascode bipolar transistors are NPN transistors, it will be understood that the principles and advantages discussed herein can be applied to PNP cascode bipolar transistors and/or a combination of NPN and PNP cascode bipolar transistors. Each of the cascode transistors can be configured as a common base amplifier. As illustrated, the first cascode transistor 22 has an emitter configured to receive an RF signal from the collector of the amplifier transistor of the first power amplifier stage 12, a base configured to receive a first signal from the bias control circuit 20, and a collector configured to provide an RF signal to the first portion 16 of the second power amplifier stage. A termination circuit 36 is electrically connected to the base of the first cascode transistor 22. The termination circuit 36 can include a series RC circuit electrically connected between the base of the first cascode transistor 22 and a reference voltage, such as ground. The resistor of the series RC circuit can provide a controlled impedance to ensure stability. The capacitor of the series RC circuit can serve as a decoupling capacitor that provides a terminating impedance for RF signals.

The second cascode transistor 24 of FIG. 2A is a cascode bipolar transistor. As illustrated, the first cascode transistor 24 has an emitter configured to receive an RF signal from the collector of the amplifier transistor of the first power amplifier stage 12, a base configured to receive a second signal from the bias control circuit 20, and a collector configured to provide an RF signal to the second portion 18 of the second power amplifier stage. A termination circuit 38 is electrically connected to the base of the second cascode transistor 24. The termination circuit 38 can include a series RC circuit electrically connected between the base of the first cascode transistor 24 and a reference voltage, such as ground. The resistor of the series RC circuit can provide a controlled impedance to ensure stability. The capacitor of the series RC circuit can serve as a decoupling capacitor that provides a terminating impedance for RF signals.

The bias control circuit 20 can generate the first signal and the second signal. The bias control circuit 20 can generate these signals based at least partly on an indication of a mode of operation of the power amplifier system 30. The first signal and the second signal can be direct current (DC) signals. These signals can be provided to respective bases of cascode transistors via resistors having relatively low impedances. The first signal can be the logical complement of the second signal in certain embodiments. Accordingly, one of the first cascode transistor 22 or the second cascode transistor 24 can be on and the other can be off in such embodiments. The signal level of the first signal and the second signal can control whether the first cascode transistor 22 and the second cascode transistor 24, respectively, are on or off. In one implementation, the first bias signal and the second bias signal can provide about a 400 mV difference between bases of the first cascode transistor 22 and the second cascode transistor 24. For instance, the base of one cascode transistor can be at about +200 mV and the base of the other cascode transistor can be at about −200 mV.

The base of the amplifier bipolar transistor can receive feedback from at least one of the collectors of the cascode bipolar transistors. As illustrated in FIG. 2A, resistors 40 and 41 are arranged in series between the collectors of the cascode transistors 22 and 24. The resistors 40 and 41 can help with stability of the circuit. The capacitor 42 can be electrically connected between the base of the amplifier bipolar transistor and an intermediate node between the resistors 40 and 41. The capacitor 42 can provide RF feedback from the cascode circuit to the base of the common emitter amplifier of the first stage 12 of the power amplifier.

The first portion 16 of the second power amplifier stage is configured to receive an RF signal from the first cascode transistor 22. This RF signal can be received by way of the capacitor 43 as shown in FIG. 2A. The capacitor 43 can serve as an alternating current (AC) coupling capacitor. In FIG. 2A, the first portion 16 of the second stage of the power amplifier is a bipolar power amplifier transistor having a base configured to receive an RF signal from the collector of the first cascode transistor 22 and provide an amplified RF signal at its collector. The bipolar power amplifier transistor can have an emitter electrically connected to ground by way of a through wafer via in certain embodiments. A termination circuit 45 can be electrically connected to the base of the power amplifier transistor. The termination circuit 45 can be electrically connected to ground by way of a through wafer via in certain embodiments. As illustrated, the output matching network 48 is electrically connected to the collector of the power amplifier transistor. The output matching network 48 can be arranged to provide output matching for a particular mode of operation of the power amplifier system. The output matching network 48 can include, for example, one or more series LC circuits electrically connected between the collector of the first power amplifier transistor and ground and one or more parallel LC circuits electrically connected in series between the collector of the first power amplifier transistor and an electrical component in an RF signal path.

The second portion 18 of the second power amplifier stage can be functionally similar to the first power amplifier portion 16. The second portion 18 of the second power amplifier stage can receive an RF signal when the second cascode transistor 24 is providing an RF signal from the first stage 16 of the power amplifier. The power amplifier transistor of the first portion 16 can be referred to as a first power amplifier transistor and the power amplifier transistor of the second portion 18 can be referred to as a second power amplifier transistor. The second portion 18 of the second power amplifier stage can be implemented by a bipolar power amplifier transistor having a different emitter area than the first portion 16 of the second power amplifier stage. For instance, each of these power amplifier transistors can be implemented by arrays of smaller transistors and the array sizes for the first portion 16 and the second portion 18 can be different. As one example, the second portion 18 can have an emitter area that is up to about 5 times bigger than the first portion 16. While illustrated as single bipolar power amplifier transistors, the first portion 16 of the second power amplifier stage and the second portion 18 of the second power amplifier stage can each be implemented be implemented by an array of bipolar transistors that together function as a single bipolar transistor. More generally, any of the transistors discussed herein can be implemented by an array of transistors as suitable. When the second portion 18 has a larger emitter area than the first portion 16, the second portion 18 can provide better performance for a higher power mode and the first portion 16 can provide better performance for a lower power mode. The termination circuits 45 and 46 can provide different termination impedances for operating in different modes of operation. As illustrated, the termination circuits 45 and 46 can each include a series LC circuit.

The matching network 49 together with the second power amplifier transistor of the second stage can be arranged to meet performance criteria for a particular mode of operation, such as a high power mode. Similarly, the matching network 48 together with the first power amplifier transistor can be arranged to meet performance criteria associated with a different mode of operation than the second power amplifier transistor and the matching network 49. The different mode of operation can be a low power mode, for example. As another example, the particular mode of operation and the different mode of operation can be associated with different frequency bands of the RF input signal RF_IN. The bias control circuit 20 and the cascode transistors 22 and 24 can provide an RF signal amplified by the first stage 12 to a particular power amplifier transistor depending on the mode of operation. The mode of operation can be associated with a power mode and/or a frequency band of the power amplifier system 30.

Figure 2B:
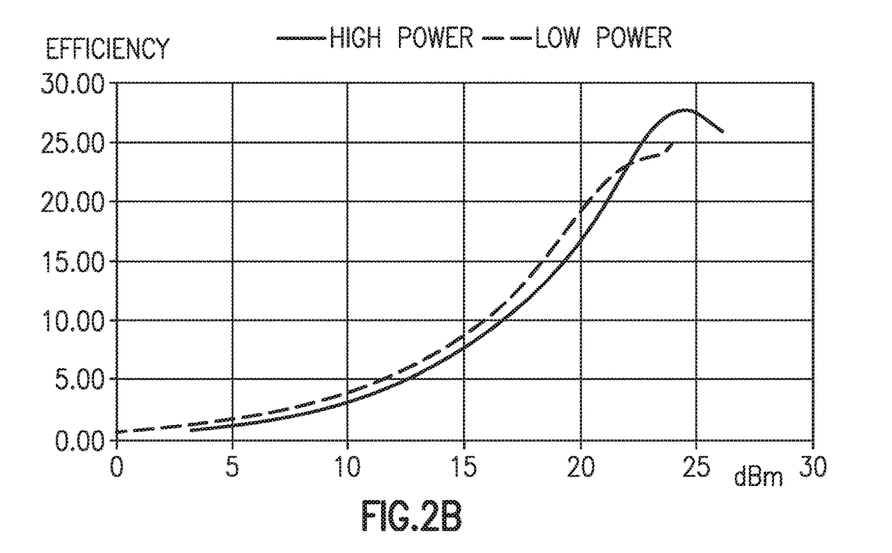
FIG. 2B is graph comparing efficiency in high power mode to efficiency in low power mode for a conventional power amplifier in which low power mode is implemented by reducing the area of a low power output power amplifier transistor relative to a high power output power amplifier transistor.
Figure 2C:
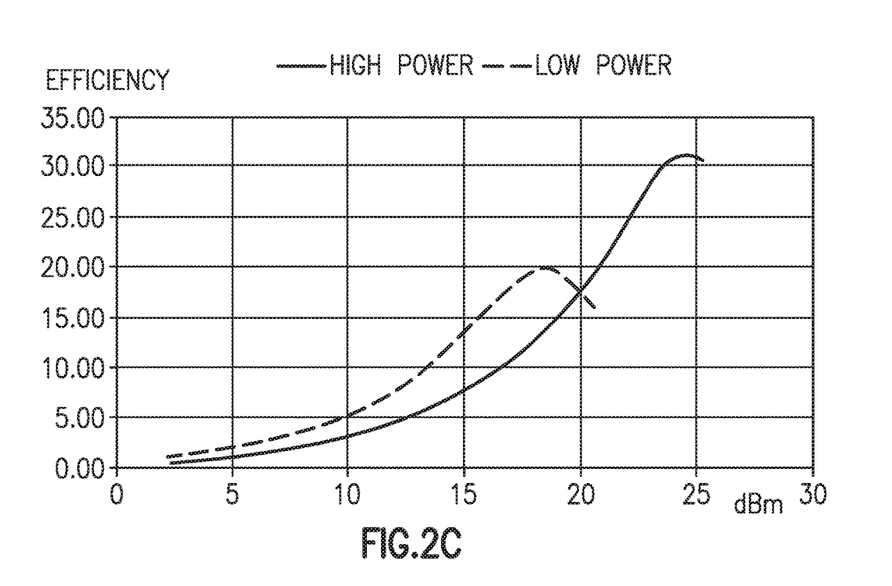
FIG. 2C is graph comparing efficiency in high power mode to efficiency in low power mode for a power amplifier with a cascode circuit between power amplifier stages according to an embodiment.

FIGS. 2B and 2C provide a comparison between efficiency of a conventional wireless local area network (WLAN) power amplifier and efficiency of a cascode switched power amplifier according to an embodiment. The curves in FIGS. 2B and 2C represent efficiency of a power amplifier as a function of output power for different power modes of operation.

FIG. 2B is graph comparing efficiency in high power mode to efficiency in low power mode for a conventional power amplifier in which low power mode is implemented by reducing the area of a low power output power amplifier transistor relative to a high power output power amplifier transistor without changing the load. The curves in FIG. 2B indicate that efficiency can improve from about 7% for high power mode to about 8% for low power mode at 15 dBm in the conventional power amplifier.

FIG. 2C is graph comparing efficiency in high power mode to efficiency in low power mode for a power amplifier with a cascode circuit between power amplifier stages according to an embodiment. The low power curve in FIG. 2C corresponds to using a cascode transistor to drive an optimized low power output stage. The curves in FIG. 2C indicate that efficiency can improve from about 7% for high power mode to about 14% for low power mode at 15 dBm in the power amplifier with the cascode circuit.

Figure 3:
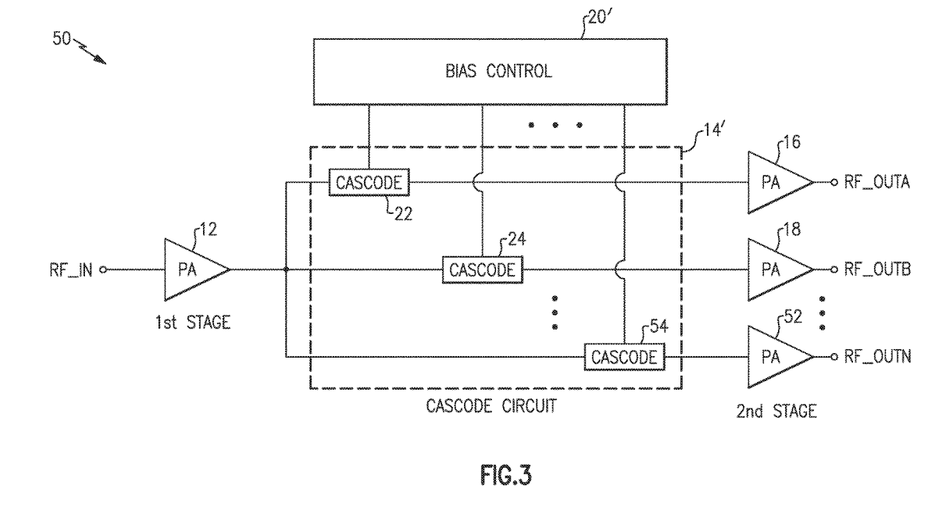
FIG. 3 is a schematic diagram of a power amplifier system that includes a multi-stage power amplifier with a cascode circuit between power amplifier stages according to an embodiment.

FIG. 3 is a schematic diagram of a power amplifier system 50 that includes a multi-stage power amplifier with a cascode circuit between power amplifier stages according to an embodiment. The power amplifier system 50 is like the power amplifier system 10 of FIG. 1 except that it includes more than two portions of the second stage that can be selectively enabled by separate cascode transistors. The power amplifier system 50 can include more elements than illustrated in FIG. 3 and/or some embodiments can include a subset of the illustrated elements. The power amplifier system 50 can be implemented on a single die.

The cascode circuit 14' is a modified version of the cascode circuit 14 of FIG. 1 that includes a cascode transistor corresponding to each portion of the second power amplifier stage. For instance, when the second stage includes three portions 16, 18, and 52, cascode transistors 22, 24, and 54 can selectively provide the output of the first stage 12 to a respective portion 16, 18, and 52 of the second stage.

The bias control circuit 20' is a modified version of the bias control circuit 20 of FIG. 1 that can provide control signals to more than two cascode transistors. The bias control circuit 20' can activate a selected one of the cascode transistors of the cascode circuit 14'. According to certain embodiments, the bias control circuit 20' can cause only one of the cascode transistors of the cascode circuit 14' is activated at a time. This can help with stability of the cascode circuit 14' and/or the power amplifier system 50. In another embodiment, the bias control circuit 20' can activate more than two of the cascode transistors at a time.

The portions 16, 18, and 52 of the second power amplifier stage can each be configured for one or more particular modes of operation. For example, each of the portions 16, 18, and 52 of the second power amplifier stage can be electrically connected to a different output matching network and/or have a different termination impedance circuit electrically coupled to its input. It will be understood that the principles and advantages discussed herein can be applied to any suitable number of power amplifier portions of a power amplifier stage. For instance, the principles and advantages discussed herein can be applied to a cascode circuit serving as a switch between a first power amplifier stage and four or more portions of a second power amplifier stage.

In certain embodiments, a cascode circuit can be disposed between stages of a plurality of different multi-stage power amplifiers. According to some embodiments, a multi-stage power amplifier can include at least three stages and a cascode circuit can function as a switch between a first stage and a second stage and another cascode circuit can function as a switch between the second stage and a third stage. Moreover, as used herein, a first stage of a power amplifier can refer to one stage of a multi-stage power amplifier and a second stage of a power amplifier can refer to a subsequent stage of the multi-stage power amplifier that receives an input from the first stage.

While some features have been discussed with reference to various power modes such as low power mode and high power mode for illustrative purposes, the principles and advantages discussed herein can be applied to any different modes. Such modes can include, for example, modes associated with different frequency bands, modes associated with different frequency bands and different power modes, different signaling modes (e.g., a nominal mode and an intermittent signaling mode such as a public safety mode like an NS_07 mode), the like, or any combination thereof.

Figure 4:
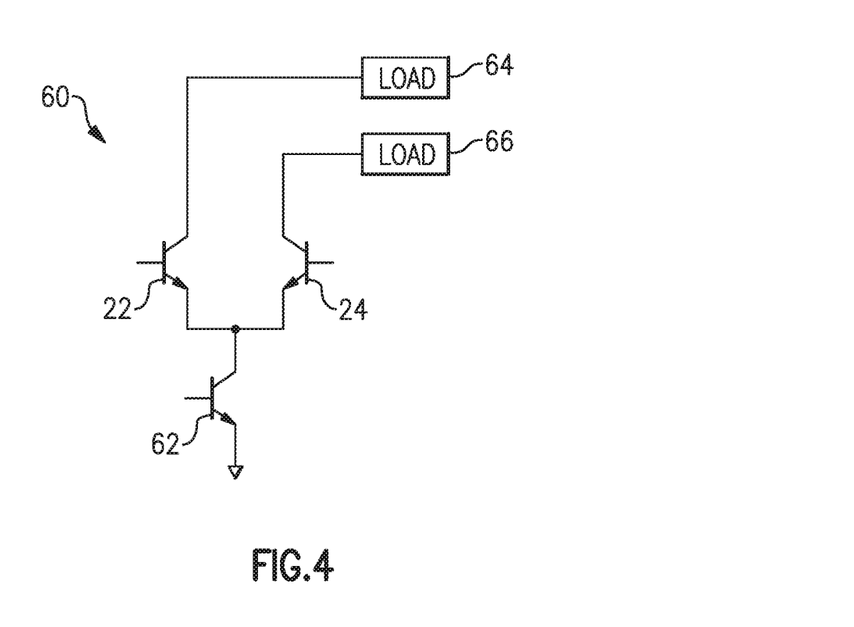
FIG. 4 is a schematic diagram of an electronic system that includes a cascode circuit having bipolar cascode transistors between an amplifier and separate loads according to an embodiment.

Although some features have been discussed with reference to power amplifiers for illustrative purposes, the principles and advantages discussed herein can be applied to any application that can benefit from using bipolar transistors and/or cascode transistors to implement a switch functionality. For example, FIG. 4 illustrates an electronic system 60 that includes an amplifier bipolar transistor 62, a first load 64, a second load 66, and a cascode circuit including a first cascode bipolar transistor 22 and a second cascode bipolar transistor 24. The first cascode bipolar transistor 22 can selectively provide an output from the amplifier bipolar transistor 62 to the first load 64 and the second cascode bipolar transistor 24 can selectively provide the output from the amplifier bipolar transistor 62 to the second load 66. In some applications, the amplifier transistor 62 can be arranged to amplify an RF signal. In some other applications, the amplifier transistor 62 can be arranged to amplify an audio signal. As another example, any of the cascode circuits discussed herein can be implemented between stages of a multi-stage RF amplifier.

In certain embodiments, a first power amplifier stage, a cascode circuit, and a second power amplifier stage can be integrated on a single die. The single die can be included in a packaged power amplifier module. One or more other components can be included on the single die. The die can be encapsulated in plastic. The single die can be a SiGe die or a heterojunction bipolar transistor (HBT) GaAs die, for example. The packaged power amplifier module can be, for example, mounted to a RF circuit board associated with the wireless communication device 511 of FIG. 6.

Figure 5A:
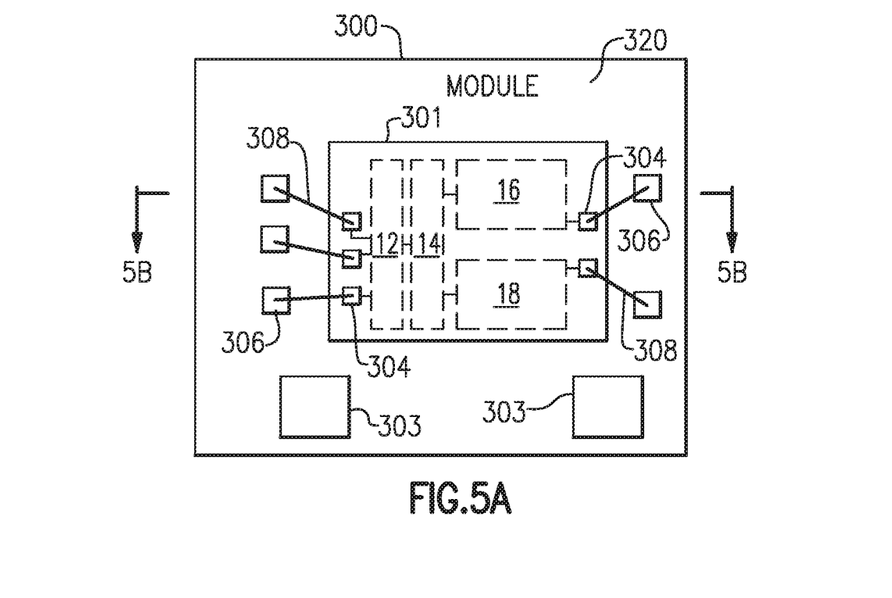
FIG. 5A is a schematic diagram of one example of a packaged power amplifier module according to an embodiment.
Figure 5B:
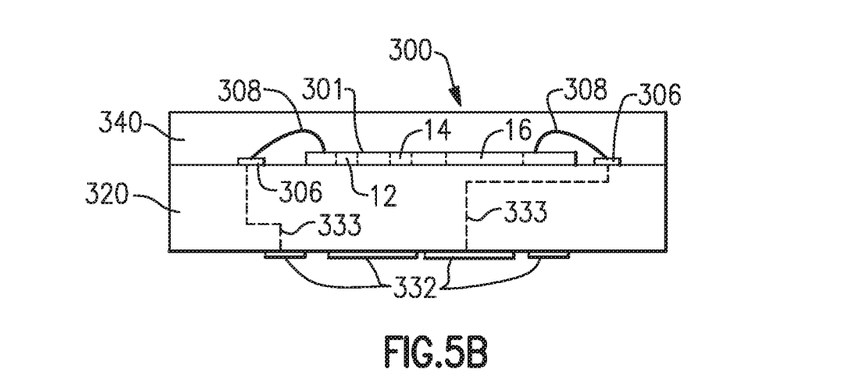
FIG. 5B is a schematic diagram of a cross-section of the packaged power amplifier module of FIG. 5A taken along the lines 5B-5B.

FIG. 5A is a schematic diagram of one example of a packaged power amplifier module 300. The power amplifier 300 can include more elements than illustrated and/or or subset of the illustrated elements. FIG. 5B is a schematic diagram of a cross-section of the packaged power amplifier module 300 of FIG. 5A taken along the lines 5B-5B.

The packaged power amplifier module 300 includes an integrated circuit (IC) or die 301, surface mount components 303, wirebonds 308, a package substrate 320, and encapsulation 340 (not shown in FIG. 5A). The package substrate 320 includes pads 306 formed from conductors disposed therein. Additionally, the die 301 includes pads 304, and the wirebonds 308 can electrically connect the pads 304 of the die 301 to the pads 306 of the package substrate 301. While wirebonds 308 are illustrated, the die 301 can be electrically connected to other circuit elements of the packaged power amplifier module 300 by different electrical connections. For instance, a flip-chip die can include bumps as electrical connections to the flip-chip die. As illustrated in FIGS. 5A and 5B, the die 301 includes the first amplifier stage 12, the cascode circuit 14, and the second power amplifier stage 16 formed therein.

The packaging substrate 320 can be configured to receive a plurality of components such as the die 301 and the surface mount components 303, which can include, for example, surface mount capacitors and/or inductors. Alternatively or additionally, the packaged power amplifier module 300 can include an integrated passive device die (not illustrated) and/or a control die (not illustrated).

As shown in FIG. 5B, the packaged power amplifier module 300 is shown to include a plurality of contact pads 332 disposed on the side of the packaged power amplifier module 300 opposite the side used to mount the die 301. Configuring the packaged power amplifier module 300 in this manner can aid in connecting the packaged power amplifier module 300 to a circuit board such as a phone board of a wireless communication device. The example contact pads 332 can be configured to provide RF signals, bias signals, power low voltage(s) and/or power high voltage(s) to the die 301 and/or the surface mount components 303. As shown in FIG. 5B, the electrical connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

The packaged power amplifier module 300 can also include one or more packaging structures to, for example, provide protection and/or to facilitate handling of the packaged power amplifier module 300. Such a packaging structure can include overmold or encapsulation 340 formed over the packaging substrate 320 and the components and die(s) disposed thereon.

It will be understood that although the packaged power amplifier module 300 is described in the context of wirebond-based electrical connections, one or more features of the present disclosure can also be implemented in other packaging configurations, including, for example, flip-chip configurations.

Figure 6:
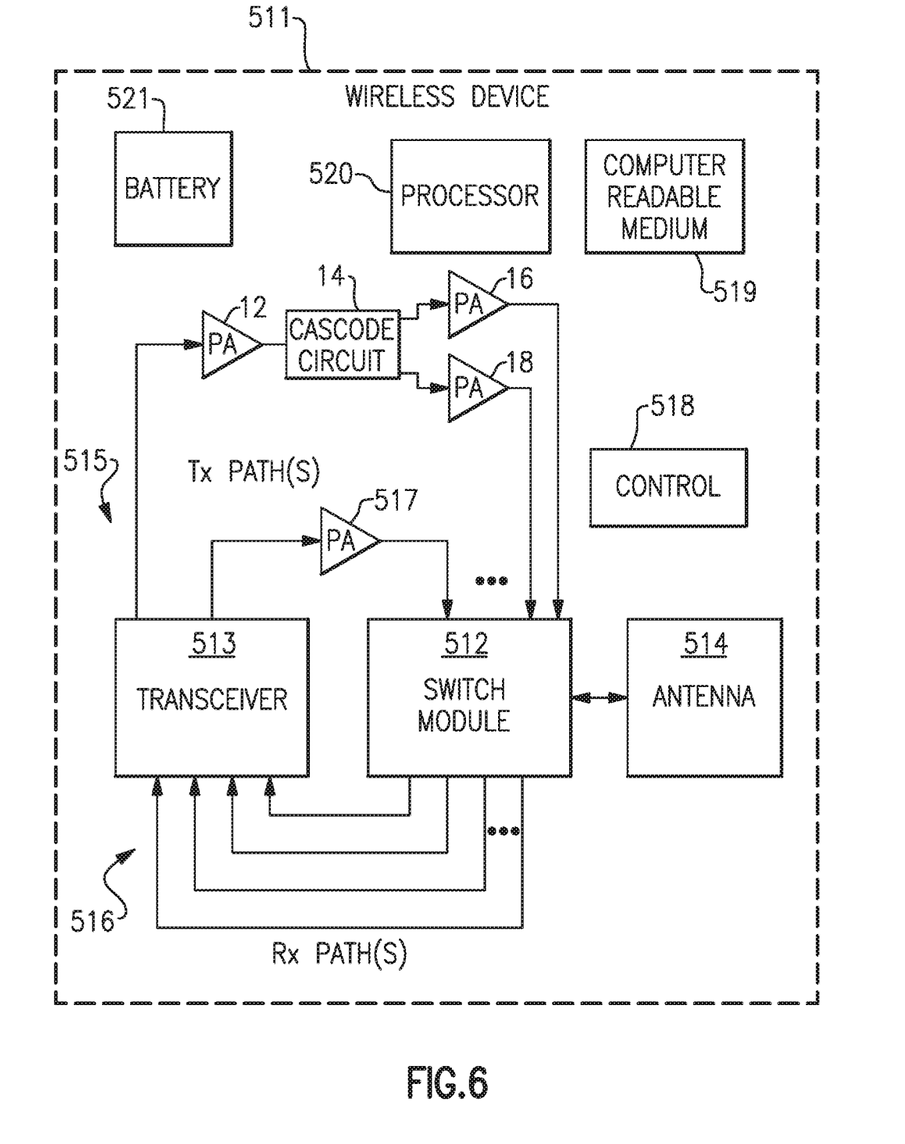
FIG. 6 is a schematic block diagram of an example wireless communication device that that include power amplifiers with cascode circuits in accordance with any of the embodiments of FIGS. 1, 2A, 3, and/or 4.

FIG. 6 is a schematic block diagram of an example wireless communication device 511 that can include one or more of the power amplifiers. The wireless communication device 511 can include a multi-stage power amplifier with a cascode circuit in accordance with the principles advantages discussed herein, for example, with reference to FIGS. 1 to 4. The wireless communication device 511 can include one or more power amplifier modules, such as one or more power amplifier modules having any combination of features discussed with reference to FIGS. 5A and 5B. In certain embodiments, the wireless communication device 511 can be a mobile phone, such as a smart phone.

The example wireless communication device 511 depicted in FIG. 6 can represent a multi-band and/or multi-mode device such as a multi-band/multi-mode mobile phone. In certain embodiments, the wireless communication device 511 can include a switch module 512, a transceiver 513, an antenna 514, the first power amplifier stage 12, the cascode circuit 14, the second power amplifier stage 16/18, one or more other power amplifiers 517, a control component 518, a computer readable medium 519, a processor 520, and a battery 521.

The transceiver 513 can generate RF signals for transmission via the antenna 514. Furthermore, the transceiver 513 can receive incoming RF signals from the antenna 514.

It will be understood that various functionalities associated with the transmission and receiving of RF signals can be achieved by one or more components that are collectively represented in FIG. 6 as the transceiver 513. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 6 as the antenna 514. For example, a single antenna can be configured to provide both transmitting and receiving functionalities. In another example, transmitting and receiving functionalities can be provided by separate antennas. In yet another example, different bands associated with the wireless communication device 511 can be provided with different antennas. In some instances, the wireless communication device 511 can include a primary antenna and a diversity antenna.

In FIG. 6, one or more output signals from the transceiver 513 are depicted as being provided to the antenna 514 via one or more transmission paths 515. In the example shown, different transmission paths 515 can represent output paths associated with different bands and/or different power outputs. For instance, a multi-stage power amplifier including the first stage 12 and the second stage 16/18 and another power amplifier 517 can represent amplifications associated with different power output configurations (e.g., low power output and high power output), and/or amplifications associated with different frequency bands. Moreover, each of these power amplifiers can include output stages configured to amplify RF signals for particular power modes of operation (e.g., low power output and high power output) and/or amplify signals associated with different frequency bands (e.g., low power, high frequency output; lower power, low frequency output; high power, high frequency output; and high power, low frequency output).

Although FIG. 6 illustrates a configuration using two transmission paths 515, the wireless communication device 511 can include more or fewer transmission paths 515.

The illustrated power amplifiers can be used to amplify a wide variety of RF signals. For example, one or more of the power amplifiers can receive an enable signal that can be used to pulse the output of the power amplifier to aid in transmitting a wireless local area network (WLAN) signal, such as a WLAN 802.11g signal, or any other suitable pulsed signal. In certain embodiments, one or more of the power amplifiers are configured to amplify a Wi-Fi signal. Each of the power amplifiers need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, an EDGE signal, or a Bluetooth signal One or more features of the present disclosure can be implemented in the foregoing example communication standards, modes and/or bands, and in other communication standards.

In FIG. 6, one or more detected signals from the antenna 514 are depicted as being provided to the transceiver 513 via one or more receiving paths 516. In the example shown, different receiving paths 516 can represent paths associated with different bands. Although FIG. 6 illustrates a configuration using four receiving paths 516, the wireless communication device 511 can be adapted to include more or fewer receiving paths 516.

To facilitate switching between receive and transmit paths, the switch module 512 can be configured to electrically connect the antenna 514 to a selected transmit or receive path. Thus, the switch module 512 can provide a number of switching functionalities associated with an operation of the wireless communication device 511. In certain embodiments, the switch module 512 can include a number of switches configured to provide functionalities associated with, for example, switching between different bands, switching between different power modes, switching between transmission and receiving modes, or any combination thereof. The switch module 512 can also be configured to provide additional functionality, including filtering and/or duplexing of signals.

FIG. 6 shows that in certain embodiments, a control component 518 can be provided for controlling various control functionalities associated with operations of the switch module 512, the power amplifiers, and/or other operating component(s). The control component 518 can be implemented on the same die as a power amplifier in certain implementations. The control component 518 can be implemented on a different die than the power amplifier in some implementations. The control component 518 can include a control and biasing circuit to bias the cascode circuit 14.

In certain embodiments, a processor 520 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 519 that can direct a computing device or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide instructions for implementing the acts specified in the flowchart and/or block diagram block or blocks.

The battery 521 can be any suitable battery for use in the wireless communication device 511, including, for example, a lithium-ion battery.

Some of the embodiments described above have provided examples in connection with power amplifiers and/or mobile devices. However, the principles and advantages of the embodiments can be used for any other systems or apparatus, such as any uplink cellular device, that could benefit from any of the circuits described herein. The teachings herein are applicable to a variety of power amplifier systems including systems with multiple power amplifiers, including, for example, multi-band and/or multi-mode power amplifier systems. The principles and advantages of the embodiments can be used for any other systems or apparatus that could benefit from a cascode circuit between power amplifier stages.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A power amplifier system comprising:
   a first power amplifier stage configured to amplify a radio frequency signal;
   a second power amplifier stage including a first power amplifier transistor and a second power amplifier transistor, the first power amplifier transistor being implemented by a first transistor array having a larger physical area than a second transistor array that implements the second power amplifier transistor; and
   a cascode circuit including a first cascode transistor and a second cascode transistor, the first cascode transistor configured to selectively provide an output from the first power amplifier stage to the first power amplifier transistor, and the second cascode transistor configured to selectively provide the output from the first power amplifier stage to the second power amplifier transistor.

2. The power amplifier system of claim 1 wherein the first power amplifier stage, the second power amplifier stage, and the cascode circuit are embodied on a single die.

3. The power amplifier system of claim 2 wherein the single die is formed using one of a silicon germanium bipolar transistor process or a gallium arsenide heterojunction bipolar transistor process.

4. The power amplifier system of claim 1 wherein the first cascode transistor is a first bipolar cascode transistor and the second cascode transistor is a second bipolar cascode transistor.

5. The power amplifier system of claim 4 wherein the first power amplifier stage includes a first power amplifier stage bipolar transistor having a collector that is electrically connected to an emitter of the first cascode bipolar transistor and an emitter of the second cascode bipolar transistor.

6. A power amplifier system comprising:
   a first power amplifier stage including a first power amplifier stage bipolar transistor configured to amplify a radio frequency signal;
   a second power amplifier stage including a first power amplifier transistor and a second power amplifier transistor;
   a cascode circuit including a first bipolar cascode transistor and a second bipolar cascode transistor, the first bipolar cascode transistor configured to selectively provide an output from the first power amplifier stage to the first power amplifier transistor, the second bipolar cascode transistor configured to selectively provide the output from the first power amplifier stage to the second power amplifier transistor, and the first power amplifier stage bipolar transistor having a collector that is electrically connected to an emitter of the first cascode bipolar transistor and an emitter of the second cascode bipolar transistor; and a feedback circuit configured to provide feedback from a collector of at least one of the first cascode bipolar transistor or the second cascode bipolar transistor to an input of the first power amplifier stage.

7. The power amplifier system of claim 5 further comprising a termination circuit electrically coupled to a base of the first cascode bipolar transistor and configured to provide a termination impedance, the termination circuit including a resistor in series with a capacitor.

8. The power amplifier system of claim 1 wherein the first power amplifier transistor is configured to receive the output of the first power amplifier stage in a high power mode and the second power amplifier transistor is configured to receive the output of the first power amplifier stage in a low power mode.

9. The power amplifier system of claim 1 wherein the first power amplifier transistor is configured to receive the output of the first power amplifier stage when the output is within a first frequency band and the second power amplifier transistor is configured to receive the output of the first power amplifier stage when the output is within a second frequency band.

10. The power amplifier system of claim 6 wherein the first power amplifier transistor is implemented by a first transistor array having a larger physical area than a second transistor array that implements the second power amplifier transistor.

11. The power amplifier system of claim 1 wherein the second power amplifier stage includes a third power amplifier transistor and the cascode circuit includes a third cascode transistor configured to selectively provide the output from the first power amplifier stage to the third power amplifier transistor.

12. A semiconductor die comprising:
a first power amplifier transistor;
a second power amplifier transistor, the first power amplifier transistor being implemented by a first transistor array having a larger physical area than a second transistor array that implements the second power amplifier transistor; and
a cascode circuit including a first cascode bipolar transistor and a second cascode bipolar transistor, the first cascode bipolar transistor configured to selectively provide a radio frequency signal to the first power amplifier transistor, and the second cascode bipolar transistor configured to selectively provide the radio frequency signal to the second power amplifier transistor.

13. The semiconductor die of claim 12 wherein an emitter of the first cascode bipolar transistor is electrically connected to an emitter of the second cascode bipolar transistor.

14. The semiconductor die of claim 13 further comprising a first stage power amplifier bipolar transistor having a collector electrically connected to the emitter of the first cascode bipolar transistor and the emitter of the second cascode bipolar transistor.

15. The semiconductor die of claim 12 wherein the cascode circuit includes silicon germanium bipolar transistors or gallium arsenide heterojunction bipolar transistors.

16. The semiconductor die of claim 12 further comprising a termination circuit electrically connected to a base of the first bipolar cascode transistor.

17. A packaged power amplifier module comprising:
a power amplifier die including a first power amplifier stage, a second power amplifier stage including a first power amplifier transistor being implemented by a first transistor array having a larger physical area than a second transistor array that implements a second power amplifier transistor, a first cascode bipolar transistor configured to selectively provide a radio frequency signal from the first power amplifier stage to the first power amplifier transistor in a first mode, and a second cascode bipolar transistor configured to selectively provide the radio frequency signal from the first power amplifier stage to the second power amplifier transistor in a second mode;
a packaging substrate on which the power amplifier die is disposed; and
an encapsulation over the packaging substrate and the power amplifier die.

18. The packaged power amplifier module of claim 17 wherein the first power amplifier transistor is a gallium arsenide heterojunction bipolar transistor.

19. The packaged power amplifier module of claim 17 further comprising a surface mounted component on the packaging substrate, the surface mounted component being in communication with the power amplifier die.

20. The packaged power amplifier module of claim 17 further comprising a wire bond providing an electrical connection from the power amplifier die to a pad on the packaging substrate.

21. The semiconductor die of claim 14 further comprising a feedback circuit configured to provide feedback from a collector of the first cascode bipolar transistor to a base of the first stage power amplifier bipolar transistor.

22. The semiconductor die of claim 16 wherein the termination circuit includes a resistor in series with a capacitor.

* * * * *